United States Patent [19]

Hawes

[11] Patent Number: 5,300,830
[45] Date of Patent: Apr. 5, 1994

[54] PROGRAMMABLE LOGIC DEVICE MACROCELL WITH AN EXCLUSIVE FEEDBACK AND EXCLUSIVE EXTERNAL INPUT LINES FOR REGISTERED AND COMBINATORIAL MODES USING A DEDICATED PRODUCT TERM FOR CONTROL

[75] Inventor: Mark A. Hawes, Boise, Id.

[73] Assignee: Micron Semiconductor, Inc., Boise, Id.

[21] Appl. No.: 883,078

[22] Filed: May 15, 1992

[51] Int. Cl.$^5$ .................................... H03K 19/173
[52] U.S. Cl. .......................... 307/465; 307/465.1
[58] Field of Search ............................ 307/465–469

[56] References Cited

U.S. PATENT DOCUMENTS

| | | |
|---|---|---|
| 3,287,702 | 11/1966 | Borck, Jr. et al. |
| 3,287,703 | 11/1966 | Slotnick |
| 3,296,426 | 1/1967 | Ball |
| 3,313,926 | 4/1967 | Minnick |
| 3,423,646 | 1/1969 | Cubert et al. |
| 3,462,742 | 8/1969 | Millen et al. |
| 3,473,160 | 10/1969 | Wahlstrom |
| 3,514,543 | 11/1970 | Crawford et al. ............. 340/324 |
| 3,535,498 | 10/1970 | Smith, Jr. |
| 3,566,153 | 2/1971 | Spencer, Jr. .................. 307/468 |
| 3,602,733 | 8/1971 | Aoki ............................. 307/209 |
| 3,702,985 | 11/1972 | Probsting ...................... 340/166 R |
| 3,737,866 | 6/1973 | Gruner .......................... 340/172.5 |
| 3,757,306 | 9/1973 | Boone ........................... 340/172.5 |
| 3,769,525 | 10/1973 | Foss et al. ..................... 307/254 |
| 3,774,171 | 11/1973 | Regetz .......................... 365/105 |
| 3,792,242 | 2/1974 | Preel ............................ 307/209 |
| 3,795,901 | 3/1974 | Boehm et al. ................. 340/172.5 |
| 3,798,606 | 3/1974 | Henle et al. .................. 340/172.5 |
| 3,803,587 | 4/1974 | Mead ............................ 340/336 |
| 3,816,725 | 6/1974 | Greer ........................... 364/716 |
| 3,818,252 | 6/1974 | Chiba et al. .................. 307/303 |
| 3,818,452 | 6/1974 | Greer ........................... 340/825.83 |
| 3,832,489 | 8/1974 | Krishna ........................ 178/71 |
| 3,849,638 | 11/1974 | Greer ........................... 364/716 |
| 3,906,255 | 9/1975 | Mensch, Jr. ................... 307/448 |
| 3,912,947 | 10/1975 | Buchanan ...................... 307/269 |
| 3,924,243 | 12/1975 | Vermeulen ..................... 364/900 |
| 3,967,059 | 6/1976 | Moore, III et al. ............. 178/58 |
| 3,974,366 | 8/1976 | Hebenstreit ................... 364/716 |
| 3,979,730 | 9/1976 | Bennett et al. ................ 364/200 |
| 3,983,538 | 9/1976 | Jones ........................... 364/716 |
| 3,987,410 | 10/1976 | Beausoleil et al. ............. 340/146.3 |
| 3,990,045 | 11/1976 | Beausoleil et al. ............. 340/146.3 |

(List continued on next page.)

FOREIGN PATENT DOCUMENTS 1444084 7/1976 United Kingdom .

OTHER PUBLICATIONS

J. E. Elliott, et al., "Array Logic Processing", IBM, (List continued on next page.)

Primary Examiner—David R. Hudspeth
Assistant Examiner—Andrew Sanders
Attorney, Agent, or Firm—Michael W. Starkweather

[57] ABSTRACT

A programmable logic device (PLD) with an output macrocell circuit is disclosed. Specifically, there is a field programmable logic array (FPLA) using a dedicated product term for macrocell control. Particularly, the macrocells contain a faster, more flexible, and exclusive feedback line as well as an exclusive external-input line from an input/output (I/O) pad for a registered mode of operation. Moreover, there is a registered mode macrocell which has 1) a feedback path for the registered mode signals which is activated even when the I/O pad driver is disabled, 2) an input path, to the logic circuitry, over an I/O pad, 3) a feedback path for the registered mode signals while outputting the same registered mode signals, and 4) a feedback path which avoids the unnecessary signal noise emanating from the use of a 3-state device or output driver. In addition, the macrocell allows for a disabled tri-state and still have the feedback intact for the combinatorial mode; thus, avoiding the extra noise that a tri-state creates.

7 Claims, 5 Drawing Sheets

U.S. PATENT DOCUMENTS

| | | | |
|---|---|---|---|
| 4,034,349 | 7/1977 | Momaco et al. | 364/200 |
| 4,034,356 | 7/1977 | Howley et al. | 340/173 |
| 4,037,089 | 7/1977 | Horninger | 235/152 |
| 4,044,312 | 8/1977 | D'Ortenzio | 328/165 |
| 4,078,259 | 3/1978 | Soulsby et al. | 364/900 |
| 4,091,359 | 5/1978 | Rossler | 340/166 R |
| 4,093,998 | 6/1978 | Miller | 364/900 |
| 4,107,785 | 8/1978 | Seipp | 364/900 |
| 4,124,899 | 11/1978 | Birkner et al. | |
| 4,128,873 | 12/1978 | Lamlaux | 364/200 |
| 4,218,740 | 8/1980 | Bennett et al. | 364/200 |
| 4,422,072 | 12/1983 | Cavlan | 340/825.87 |
| 4,554,640 | 11/1985 | Wong et al. | 364/716 |
| 4,717,912 | 1/1988 | Harvey et al. | 340/825.87 |
| 4,742,252 | 5/1988 | Agrawal | 307/465 |
| 4,758,746 | 7/1988 | Birkner | 307/468 |
| 4,763,020 | 8/1988 | Takata et al. | 307/465 |
| 4,771,285 | 9/1988 | Agrawal et al. | 340/825.83 |
| 4,789,951 | 12/1988 | Birkner | 307/465 |
| 4,847,612 | 7/1981 | Kaplinsky | 340/825.8 |
| 4,879,481 | 11/1989 | Pathak | 307/465 |
| 4,918,641 | 4/1990 | Igour et al. | 364/716 |
| 4,963,768 | 10/1990 | Agrawal et al. | 307/465 |
| 4,967,107 | 10/1990 | Kaplinsky | 307/465 |
| 5,012,135 | 4/1991 | Kaplinsky | 307/465 |
| 5,027,011 | 6/1991 | Steele | 307/465 |
| 5,027,315 | 6/1991 | Agrawal et al. | 364/900 |
| 5,028,821 | 7/1991 | Kaplinsky | 307/465 |
| 5,055,718 | 10/1991 | Galbraith et al. | 307/465 |
| 5,059,828 | 10/1991 | Tanagawa | 307/465 |
| 5,121,006 | 6/1992 | Pedersen | 307/465 |
| 5,136,188 | 8/1992 | Ha et al. | 307/465 |
| 5,148,391 | 9/1992 | Zagar | 365/96 |
| 5,166,556 | 11/1992 | Hsu et al. | 307/465 |
| 5,168,177 | 12/1992 | Shankar et al. | 307/465 |
| 5,220,215 | 6/1993 | Douglas | 307/465 |
| 5,235,221 | 8/1993 | Douglas | 307/465 |

OTHER PUBLICATIONS

Tech. Disclosure Bulletin, vol. 18, No. 21, Jul. 1973, pp. 219 & 220.

H. Fleisher, et al., "Reconfigurable Machine", IBM Tech. Disclosure Bulletin, vol. 16, No. 10, Mar. 1974, pp. 221, 222 & 223.

H. Flersher et al, "An Introduction to Array Logic" IBM J. Research & Development, Mar. 1975, pp. 98–104.

Jones, "Array Logic Macros" IBM J. Research and Development, Mar. 1975, pp. 120–126.

Andres, "MOS Programmable Logic Arrays" a Texas Instrument Application Report Oct. 1970, pp. 1–13.

Barna et al, Integrated Circuits in Digital Electronics John Wiley & Sons 1973, pp. 412–419 and 84–91 and FIGS. 11–34.

Wood "High Speed Dynamic Programmable Logic Array Chip" IBM J. Res. Develop. Jul. 1975, pp. 379–381.

Boysel, "Memory on a Chip: a step toward large-scale Integration" Electronics, Feb. 6, 1967, pp. 93–97.

Wilkas et al, "The design of the Control Unit of an Electronic Digital Computer" The Institution of Electrical Engineers, Jun. 1957, pp. 121–128.

Mrasek, "PLAs Replace ROMs for Logic Designs" Electronic Design Oct. 25, 1973, pp. 66–70.

Howley et al. "Programmable Logic Array Decoding Technique" IBM Tech. Disclosure Bulletin, vol. 17, N. 10, Mar. 1975-p. 2988.

Hemel "The PLA: a different load of ROM" Electronic Design, Jan. 5, '76, pp. 78–84.

Kidder, The Soul of a New Machine, 1982, pp. 118–128 and 268–269.

National Semiconductor Inc. "Data Update MOS." Aug. 1972, pp. 86 and 87.

Blakeslee, Digital Design with Standard MSI and LSI, John Wiley and Sons, 1975, pp. 67–77, 94–99, and 104–105.

PAL Handbook, Monolithic Memories, Inc. 1978, p. N/A.

Hurtin et al. "A Simplified Summation Array for Cellular Logic Modules" IEEE Trans. on Computers, Feb. 1974, pp. 203–206.

Programmable Logic-A Basic Guide for the Designer, Data I/O Corp. 1983-pp. 20–25.

The TTL Data Book for Design Engineers, Texas Instruments Inc., 1973, pp. 295, 303, 473, 458 and 480.

Monolithic Memories Inc. form 10-K, Oct. 3, 1982, Annual Report Pursuant to Section 13 or 15(d) of the Securities Exchange Act of 1934.

"The Role of Software in the Growth of PLDs" The Technology Research Group Letter, vol. 1, N. 13, Nov. 1985, p. 3.

Teil et al. "A Logic Minimizer for VLSI PLA Design" ACM IEEE Ninteenth Design Automation Conf. Proceedings, Jun. 82, pp. 156–162.

Marrin, "Programmable Logic Devices Gain Software Support" EDN Feb. 9, 1984, pp. 67–74.

Monolithic Memories Annual Report 1981, Letter to Schareholders, p. 2.

Semicustom IC Update, Field Programmable Logic Devices, "Visa from the Valley", Hambrecht & Grist Inc., vol. 3, No. 1, Mar. 1986, pp. 4–7.

Phelps Institutional Research Report on Monolithic Memories, Inc., a publication of Woodman, Kirkpatrick & Gilbrath Aug. 30, '84.

Wood, "High-Speed Dynamic Programmable Logic Array Chip" IBM J. Res. Develop Jul. 1975, pp. 379–381.

Cavlan et al. "Field PLAS Simplify Logic Designs" reprinted from Electronic Design, Sep. 1, 1975.

Signetics, Biopolar and MOS Memory Data Manual Signetics Inc., pp. 156–165, Jan. 1979.

Dorman "PLAS of MPs at times they compete at times they cooperate" Electronic Design, 18 Sep. 1, 1976, pp. 24–30.

Elliot et al "Array Logic Processing" IBM Tech. Disclosure Bulletin, vol. 16, No. 2, Jul. 1973, pp. 586–587.

MacWorld, The Macintoch Magazine, May–Jun. 1984.

Use of Laser Mechanism in printers breaks Price and Maintenance, Barriers, Jan. 15, '85, p. 277.

PROGRAMMABLE LOGIC DEVICE MACROCELL WITH AN EXCLUSIVE FEEDBACK AND EXCLUSIVE EXTERNAL INPUT LINES FOR REGISTERED AND COMBINATORIAL MODES USING A DEDICATED PRODUCT TERM FOR CONTROL

CROSS-REFERENCES TO RELATED OR COPENDING APPLICATIONS

U.S. patent application Ser. No. 07/817,167, filed June 6, 1992, is a CMOS logic cell for high-speed, zero-power programmable array logic devices, having common assignee with the present invention.

U.S. patent application Ser. No. 07/865,007, filed Apr. 8, 1992, is a field programmable logic array with speed optimized architecture, having common assignee with the present invention.

U.S. patent application Ser. No. 884,104, filed May 15, 1992, is a field programmable logic array with two OR planes, having common assignee with the present invention.

U.S. patent application Ser. No. 884,489, filed May 15, 1992, is a programmable logic device macrocell with two or array inputs, having common assignee with the present invention.

U.S. patent application Ser. No. 883,759, filed May 15, 1992, is a programmable logic device with a single parameter state decode, having common assignee with the present invention.

U.S. patent application Ser. No. 883,076, filed May 15, 1992, is a programmable logic device macrocell with an exclusive feedback line and an exclusive external input line, having common assignee with the present invention.

U.S. patent application Ser. No. 884,505, filed May 15, 1992, is a programmable logic device macrocell with an exclusive feedback line and an exclusive external input line for a combinatorial mode and accommodating two separate programmable OR planes, having common assignee with the present invention.

U.S. patent application Ser. No. 883,843, filed May 15, 1992, is a programmable logic device macrocell with an exclusive feedback line and an exclusive external input line for a state counter or registered sum-of-products signal, having common assignee with the present invention.

FIELD OF THE INVENTION

The present invention relates to integrated circuits (ICs), specifically field programmable logic arrays (FPLA). Particularly, an FPLA having macrocells that contain a faster, more flexible, and exclusive feedback line and external-input line. Uniquely, a macrocell accommodating two logical OR arrays and a single input/output pad.

BACKGROUND OF THE INVENTION

HISTORY

The introduction of programmable logic devices (PLDs) was a true revolution in the hardware design world. It enabled engineers to shrink circuits requiring several devices onto a single device thus simplifying their designs while saving space and power. Traditionally, PLDs have been used in combinational circuits such as address decoders as well as sequential circuits such as bus arbitration schemes. During the last few years, advances and improvements in PLD architectures enabled the devices to grow more complex while addressing the never-ending quest for higher density and faster speeds. Despite these improvements, engineers still face certain problems and limitations when implementing.

A typical programmable logic device is composed of a user-programmable AND array, a fixed or programmable OR gate or array, followed by a macrocell comprising output registers, a feedback path to the programmable AND array, and output pads. The AND and OR arrays make up a logic circuit. The existence of a feedback path from the output registers or buffers to the logic circuit makes PLDs ideal candidates for state machine implementations.

PROBLEMS

Although the feedback paths allow for architecture that implements state machines, these architectures have been encumbered with inefficient and non-flexible feedback paths. Specifically, these inflexible paths never allow for a registered mode macrocell which has 1) a feedback path for the registered mode signals which is activated even when the I/O pad driver is disabled, 2) an input path, to the logic circuitry, over an I/O pad, 3) a feedback path for the registered mode signals while outputting the same registered mode signals, and 4) a feedback path which avoids the unnecessary signal noise emanating from the use of a 3-state device or output driver.

Nor have these inflexible and inefficient paths ever allowed for a disabled tri-state and still have the feedback intact for the combinatorial mode. Additionally, when the feedbacks process through the output buffer there is significant noise and time delay added to the circuit.

This ability to disable an output buffer/driver and have inputs over an I/O pad for a registered or combinatorial mode of operation would be very useful. Similarly, the ability to disable the output driver and have feedbacks to the logic circuitry for a registered or combinatorial mode of operation would be very useful.

For example, and related to the registered mode, but not limited to this example, in a state machine, a pre-loadable down counter is often used. Thus the computer may want to access memory for a 256 count and sample what the count is as it approaches zero. Then the down counter may be reset to a 172 count to wait for a video to boot up.

One skilled in the art will realize that data buses would ideally be located next to the output/input (I/O) pads. In prior configurations, the data bus would have one branch extend to the outputs and a second separate line extending to the inputs of the logic circuitry located on the other side of the chip. However, with an I/O pad architecture, the pad can receive a new pre-loadable down count, for the next operation, via the original data bus located next to the I/O pad. Thus, eliminating the need for extra data bus circuitry, and saving chip real estate.

Similarly, and relating to the combinatorial mode, one skilled in the art will understand that a three-state has a relatively large signal delay and creates a large amount of signal noise. Additionally, it is noted that prior architecture had no exclusive feedback line, but a sharing of the feedback and input line in the combinatorial mode. As a result, there is no way to disable the output pad buffer and still be able to feedback the sumof-products. This ability to disable, yet still feedback, is a mode of operation that would be very useful to engineers in their uses of integrated circuits.

In solving these problems, there are issues involving the re-routing of signals and the control of the re-routing of these signals. Concerning control of signal routings, muxes are generally used. However, muxes must be controlled or directed from some source. Usually, the source will be a product term from the AND array or a sum-of-products term from an OR array. However, other problems occur in using these as controls.

When using terms from a large logic matrix, such as AND and OR arrays, attention must be paid to both timing limitations and complexity created limitations. Specifically, concerning the timing, in order to maintain a specific speed of a semiconductor chip, certain product terms, which are located more than 10 to 15 product terms away from a selected macrocell to control, will add significant timing concerns.

Similarly, the complexity limitations occur when there are complex architecture designs requiring the use of all product terms. Thus, there are no product terms left for controlling macrocell activities.

Therefore, a need exists for a control for each macrocell which avoids the timing and complexity limitations.

SOLUTIONS

Therefore, it has been demonstrated that a need exists for a registered mode macrocell which has 1) a feedback path for the registered mode signals which is activated even when the I/O pad driver is disabled, 2) an input path, to the logic circuitry, over an I/O pad, 3) a feedback path for the registered mode signals while outputting the same registered mode signals, and 4) a feedback path which avoids the unnecessary signal noise emanating from the use of a 3-state device or output driver.

Similarly, it has been demonstrated that a need exists for a combinatorial mode macrocell which has an efficient and more flexible feedback path, yet provides for an input line from the I/O pad for the combinatorial mode. Particularly, a feedback path which avoids unnecessary signal noise being injected (returned) into the logic array, and that feeds back even when the pad is disabled.

Finally, it has been demonstrated that a need exists for a control system for the macrocell routing of signals that avoids timing and complexity limitations.

It is noted that the above described problems, as well as other problems, are solved through the subject invention and will become more apparent, to one skilled in the art, from the detailed description of the subject invention.

SUMMARY OF THE INVENTION

One skilled in the art will appreciate the advantage of the subject macrocell architecture. Specifically, there is a semiconductor which provides for: 1) a feedback path for the registered mode signals which is activated even when the I/O pad driver is disabled, 2) an input path, to the logic circuitry, over the I/O pad, 3) a feedback path or the registered mode signals while outputting the same registered mode signals, and 4) a feedback path which avoids the unnecessary signal noise emanating from the use of a 3-state device or output driver. Clearly, providing an exclusive logic signal feedback line to the logic circuitry and providing an exclusive external signal input line to the logic circuitry will solve the subject registered mode problems and provide the beneficial flexibility.

Similarly, one skilled in the art will appreciate the advantage of the subject combinatorial macrocell architecture. Specifically, there is an integrated circuit which has a feedback path which avoids the unnecessary signal noise emanating from the use of a 3-state device or output driver; and there is a feedback path which is activated even when the I/O pad driver is disabled. Clearly, providing an exclusive logic signal feedback line to the logic circuitry and providing an exclusive external signal input line to the logic circuitry for the combinatorial mode will solve the subject problems and provide the additional flexibility.

Finally, there is provided a macrocell control system for routing signals which avoids serious timing and complexity limitations. Specifically, one skilled in the art will recognize, these problems are solved by providing a ninth dedicated product term, from each grouping of eight terms in the AND array, for each macrocell. These dedicated product terms will provide control logic signals for controlling to certain muxes.

Features of the present invention will become more clear from the following detailed description of the invention, taken in conjunction with the accompanying drawings.

DETAILED DESCRIPTION OF THE ILLUSTRATED EMBODIMENT

INCORPORATED MATERIAL

For the purpose of providing background material which may in some respects illustrate the state of the art, the following books are herein incorporated by reference: "Programmable Logic Handbook," fourth edition, by Monolithic Memories Inc., 2175 Mission College Blvd., Santa Clara, Calif.; and "Practical Design Using Programmable Logic," by D. Pellerin and M. Holley, Prentice Hall, library of Congress no. TK7872 .L64 P44 1991.

The following U.S. patents are herein incorporated by reference: U.S. Pat. No. 3,423,646, is a computer logic device consisting of an array of tunneling diodes, isolators and short circuits. U.S. Pat. No. 3,566,153, is a programmable sequential logic device. U.S. Pat. No. 4,124,899, is a programmable array logic circuit. U.S. Pat. No. 4,717,912, an apparatus for producing any one of a plurality of signals at a single output. U.S. Pat. No. 4,758,746, is a programmable logic array with added array of gates and added output routing flexibility.

DEFINITIONS

A macrocell is generally defined as an output circuitry coupled to the end of a logic circuitry - such as a logical OR array - and typically containing multiplexers, buffers, drivers, registers, etc., and sometimes an input/output pad. "External inputs" terminology is used to describe the fact that the input/output (I/O) pad allows for input signals from an external source as well as outputting signals over the pad. A register is also commonly referred to as a flip-flop, memory element, or a device which creates a stored signal or registered signal. "Sum-of-products" is a term used to describe a resultant signal that has gone through a logical AND array and a logical OR array. "Registered or combinatorial modes" refer to the fact that there are two logical OR arrays leading to multiple macrocell outputs. A first OR has outputs which are registered or are sent through a register, and is referred to as a registered mode. The second OR outputs do not register the outputs and is thus referred to as a combinatorial/combinational mode. This invention deals with both modes of operation. Abbreviations are commonly used that are well know such as "mux" for multiplexer. "Dedicated product terms" refers to a line originating in the AND array and is exclusively connected to the macrocell architecture for exclusive use as a control signal.

SPECIFIC EMBODIMENT

Figure 1:
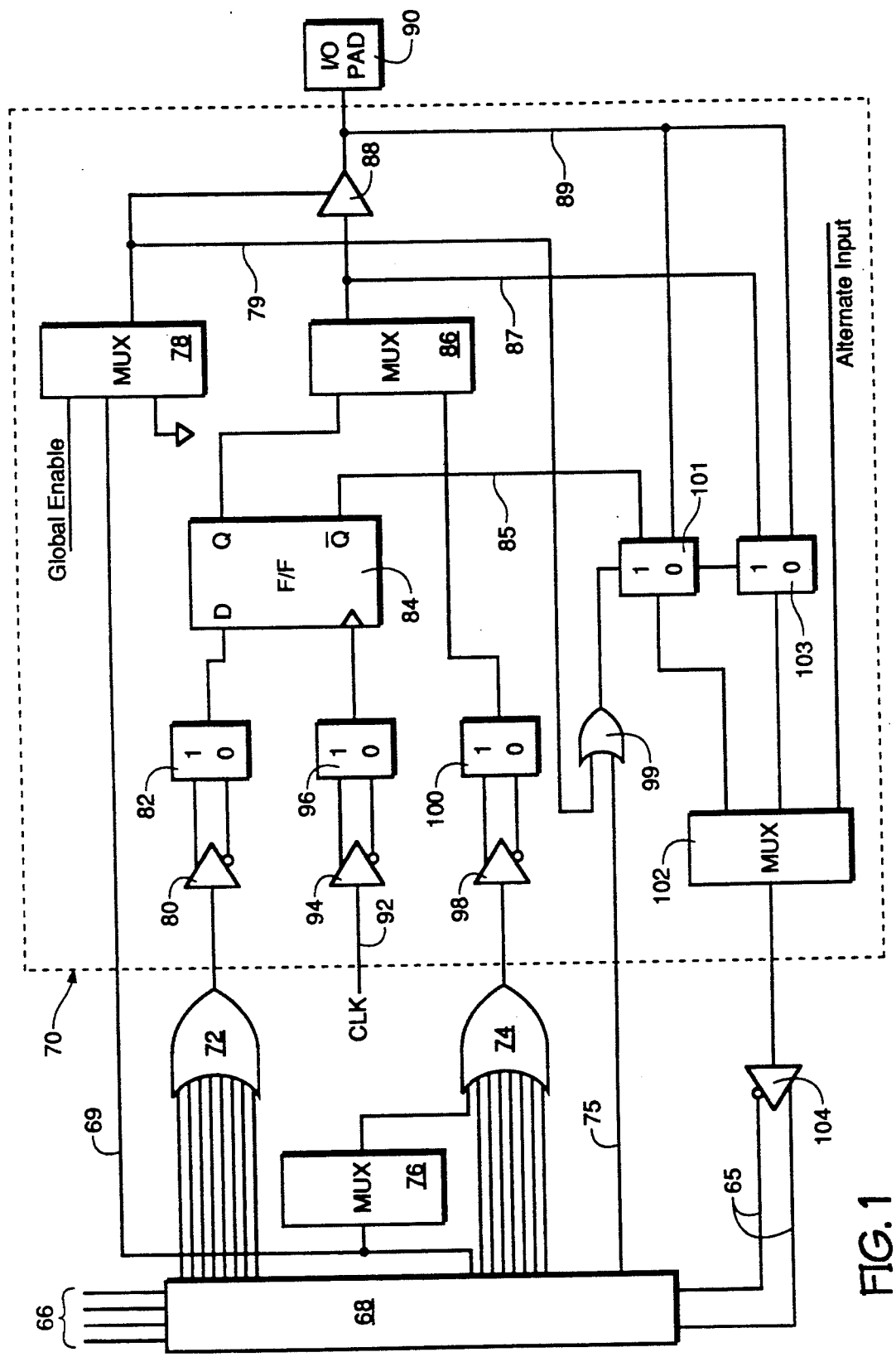
FIG. 1 is a detailed illustration of the invention.

FIG. 1 is a detailed illustration of the invention and includes the following elements: Leading into the macrocell 70 are two logical OR arrays 72 (the register mode signals) and 74 (the un-registered or combinational mode signals). Multiplexer 78 also is connected to the AND array via line 69. Mux 78 also has a global enable line and other possible selections commonly used which are not shown. From array 72 there is in sequence a buffer 80, multiplexer 82, a D-type flip-flop or register 84 (creating the registered mode), a multiplexer 86, a tri-state 88 (or input/output pad driver), and input-/output (I/O) pad 90. Clock signal, CLK, 92 is coupled to register 84 via buffer 94 and multiplexer 96.

Array 74 couples to multiplexer 86 via buffer 98 and multiplexer 100 and thereby to buffer 88 and I/O pad 90. Multiplexer 76 takes a product term from AND array 68 via line 69 and can route it to OR 74. Also, AND array 68 has a product term coupled to mux 78 via line 69. It is further noted that line 69 is routed directly from AND array 68 to mux 78, and does not go to an OR array unless mux 76 grabs the line.

Mux 101, acting as a switch, receives and switches between inputs from Q-bar (an exclusive registered feedback line) and exclusive external input line 89. Mux 101 is controlled or gated from logical OR gate 99 which directs whether mux 101 is a logical "1" (Q-bar, exclusive feedback) or "0" (line 89, exclusive input). The lone output from mux 101 serves as an input line to programmable AND array 68 via input mux 102, input buffer 104, and AND array input lines 65

Mux 103, acting as a switch, receives and switches between inputs from OR array 74 via mux 86 and line 87 (an exclusive combinatorial feedback line) and exclusive external input line 89. Mux 103 is likewise controlled or gated from logical OR gate 99 which directs whether mux 103 is a logical "1" (exclusive feedback) or "0" (line 89, exclusive input). The lone output from mux 103 serves as an input line to programmable AND array 68 via input mux 102, input buffer 104, and AND array input lines 65. AND array 68 also has inputs 66.

Mux 102 is a static programmed to receive signals from either alternate input, usually from another macrocell, or from mux 101 or 103.

OR gate 99 receives input signals from 1) a dedicated ninth product term from AND array 68 via line 75, and 2) a product term from AND array 68 via line 69, mux 78, and line 79. It is noted that at no time does the macrocell feed back any signals via line 89 because of the logic of gate 99.

REGISTERED MODES OF OPERATION

One skilled in the art will appreciate the operation of the invention. Specifically, there are six primary modes of operation; three registered modes and three combinatorial modes.

Figure 2A:
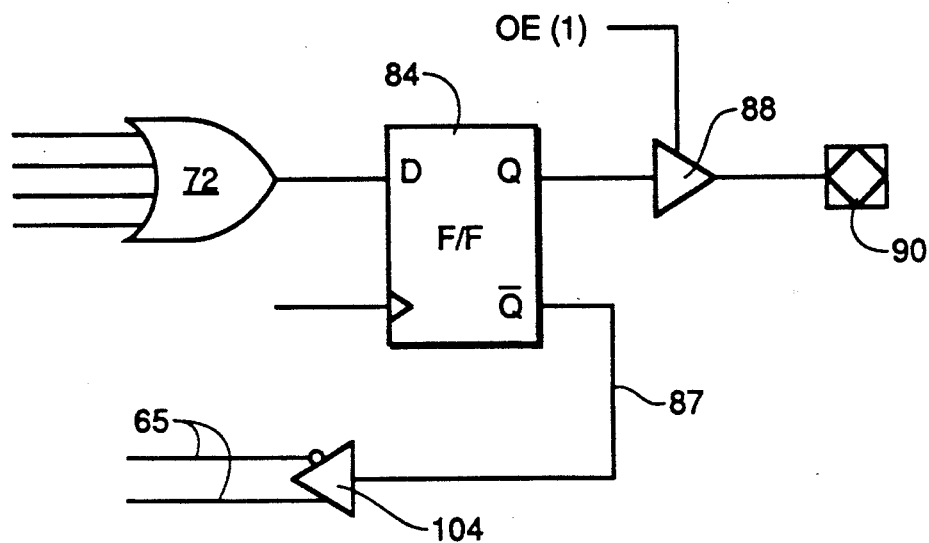
FIGS. 2A–C are illustrations of configurable modes of operation for the combinatorial circuits.

The first registered mode, referring to FIGS. 1 and 2A, occurs when mux 78 output enables -OE(1)- three-state 88, by sending a logical "1". This mode allows for outputting of logic signals from the registered logic circuitry (array 72) over I/O pad 90. Simultaneously, in this first mode, mux 101 is set to a "1" which is controlled from the logical OR 99 receiving a signal from mux 78 via line 79 and a signal from AND array 68 via line 75. Thus, selecting the exclusive logic signal feedback line 85 from Q-bar. Thereby allowing feedback logic signals to be coupled to logic circuit input lines 65 via AND array input buffer 104, and mux 102. It is again noted that mux 102 may choose either the combinatorial or registered modes as well as the alternate inputs.

Figure 2B:
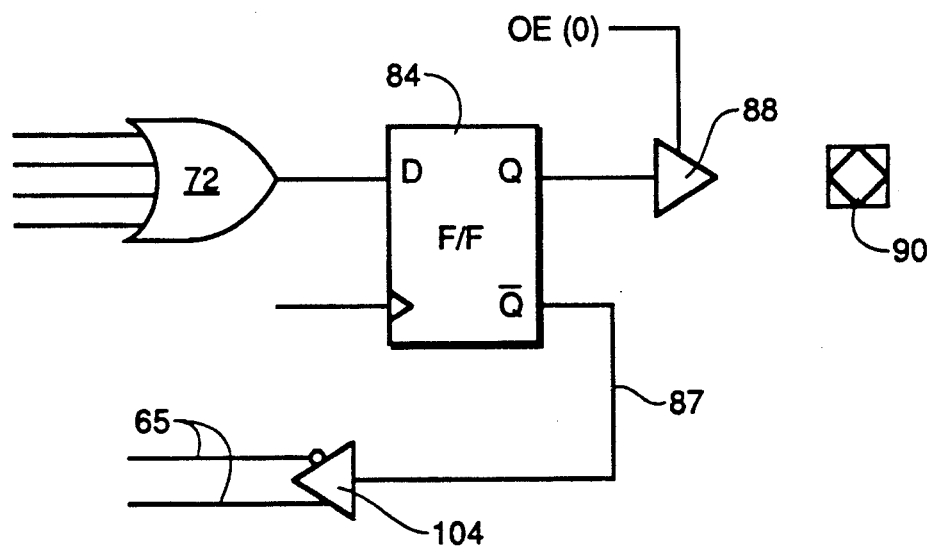

Referring to FIGS. 1 and 2B, the macrocell's second registered mode occurs when mux 78 disables three-state 88, by sending a logical "0", represented by output enable zero or OE(0). Thus, this will not allow any signals to output over pad 90. Simultaneously, mux 101 is set to a "1" which operates as described in the first mode above. Thus, again selecting the exclusive logic signal feedback line 85, from q-bar, as described in the first mode above. Specifically, in this second mode, the circuitry is capable of having the pad 90 disabled yet have registered signals from array 72 feedback into the logic circuitry of AND array 68.

Figure 2C:
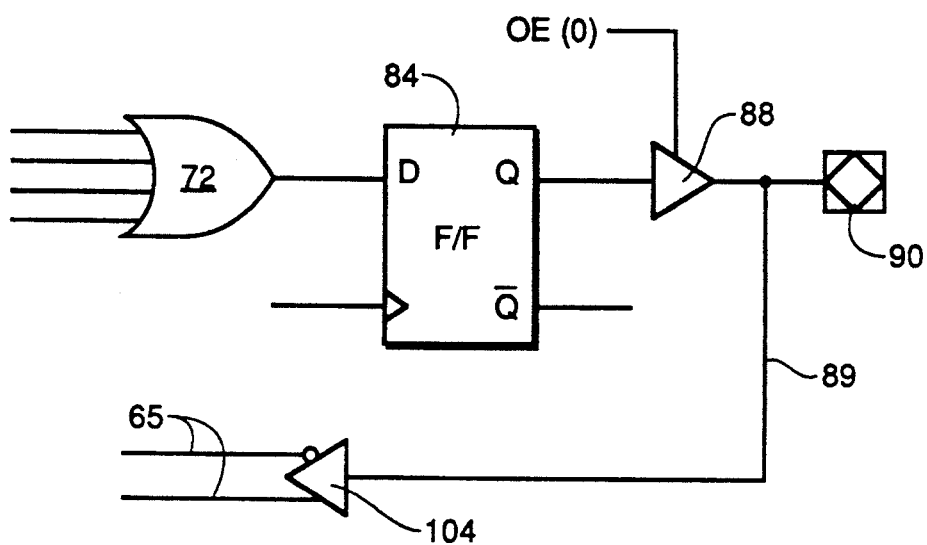

Referring to FIGS. 1 and 2C, the third registered mode occurs when mux 78 disables three-state 88, as described in mode two and achieving the same results. Simultaneously, and unlike the previous modes, mux 101 is set to a "0" by a similar control or gating fashion as described above. Thus, exclusive input line 89 is selected and may feed into AND 68 in a similar fashion as described above.

COMBINATORIAL MODES OF OPERATION

Figure 3A:
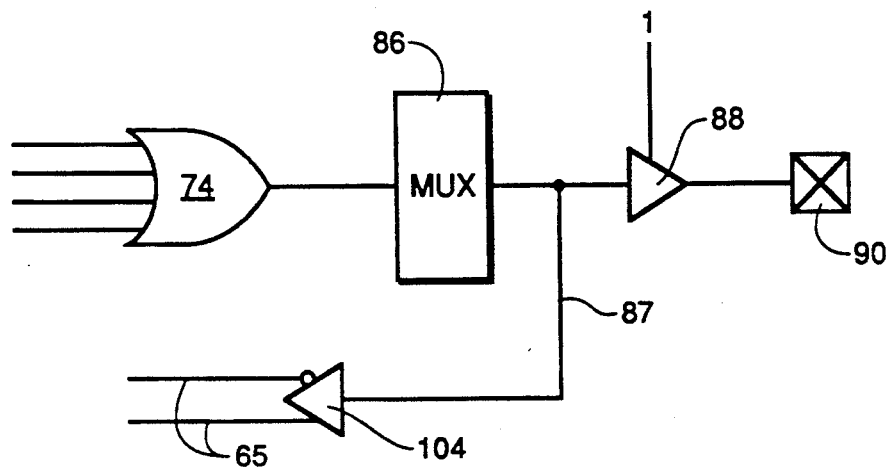
FIG. 3A–C are illustrations of configurable modes of operation for the registered circuits.

One skilled in the art will appreciate the operation of the three primary combinatorial modes for the macrocell circuit. The first combinatorial mode, referring to FIGS. 1 and 3A, occurs when mux 78 enables 3-state 88, by sending a logical "1". This mode allows for outputting of logic signals from the logic circuitry (arrays 72 and 74) over I/O pad 90. Simultaneously, in this first mode, mux 103 is set to a "1" which is controlled from the logical OR 99 receiving a signal from mux 78 via line 79 and a signal from a ninth product term via line 75. Thus, selecting the exclusive logic signal feedback line 87. Thereby allowing feedback logic signals to be coupled to logic circuit input lines 65 via AND array input mux 102 and input buffer 104. Again it is noted that mux 102 does select between the combinatorial and registered modes.

It is noted that this mode avoids the signal noise and timing delays associated with signals that would pass through a three-state or output buffer.

Figure 3B:
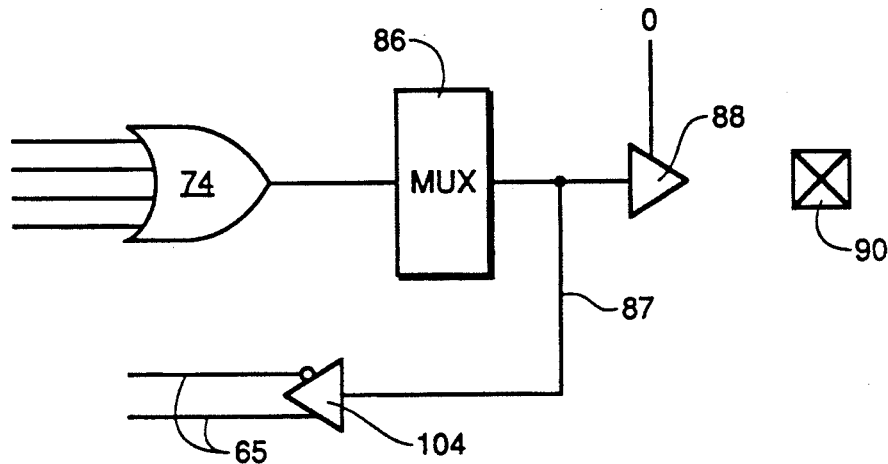

Referring to FIGS. 1 and 3B, the macrocell's second combinatorial mode occurs when mux 78 disables three-state 88, by sending a logical "0". Thus not allowing any signals to output over pad 90. Simultaneously, mux 103 is set to a "1" which operates as described in the first combinatorial mode above. Thus, again selecting the exclusive logic signal feedback line 87 as described in the first mode above. Specifically, in this second mode, the circuitry is capable of having the pad 90 disabled yet have signals from array 74 feed back into the logic circuitry of AND array 6B.

Figure 3C:
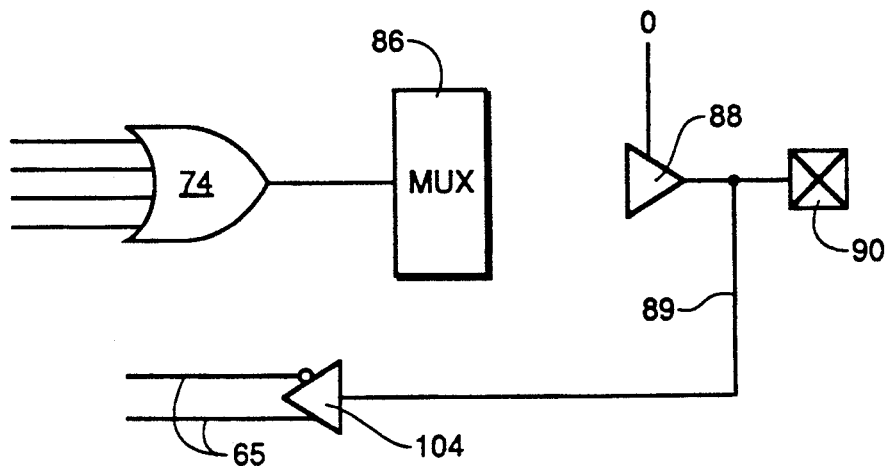

Referring to FIGS. 1 and 3C, the third combinatorial mode occurs when mux 78 disables three-state 88, as described in combinatorial mode two and achieving the same results. Simultaneously, and unlike the previous modes, mux 103 is set to a "0" by a similar fashion as described above. Thus, exclusive input line 89 is selected and may feed into AND 68 in a similar fashion as described above.

PARTICULAR EMBODIMENT

Figure 4:
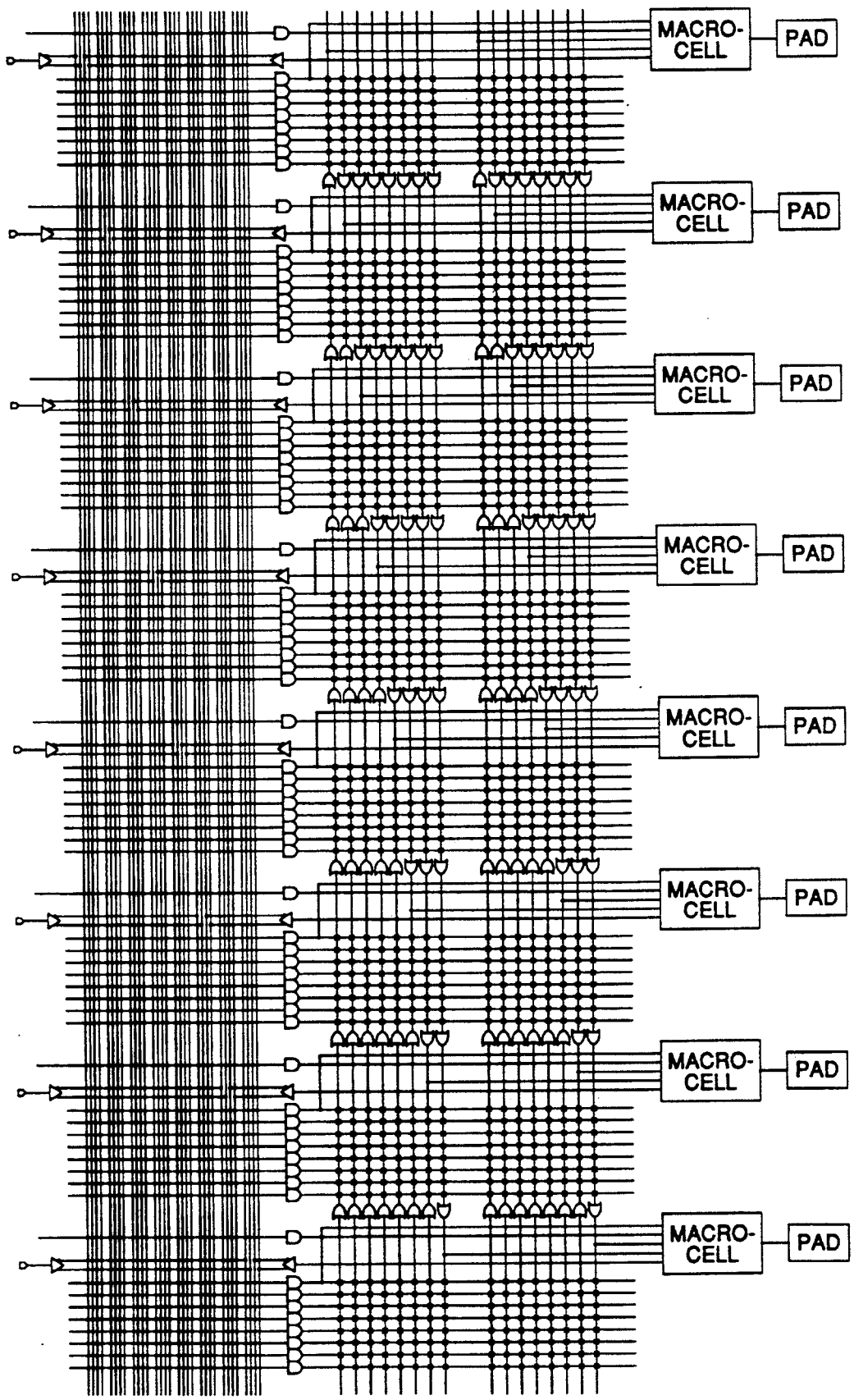
FIG. 4 illustrates an embodiment of the invention being utilized in a field programmable logic device.

FIG. 4 illustrates an embodiment of the invention being utilized in a field programmable logic device, and is an overall view of the prior drawings. One skilled in the art will recognize that there is a programmable AND array with inputs and outputs. Similarly, there are two programmable OR arrays which rout signals through various levels or numbers of logical OR gates before the sum-of-products are sent to designated macrocells. It is noted that there is a ninth product term for each set or grouping of eight product terms. Thus, these dedicated product terms are physically located close to the macrocell for which they serve.

VARIATIONS IN THE INVENTION

There are several obvious variations to the broad invention and thus come within the scope of the present invention. Uniquely, this invention may work on any number of ICs utilizing I/O and feedback lines from either a registered or combinatorial mode. For example, a PLD using fixed ORs or static logic. Field programmability is not required for utilizing this invention.

While the invention has been taught with specific reference to one embodiment, someone skilled in the art will recognize that changes can be made in form and detail without departing from the spirit and the scope of the invention.

Although subheadings in the Detailed Description of the Illustrated Embodiment are used, these are merely provided for assisting the reader; wherein, the writer is free to enter any information under any heading/s.

I claim:
1. An integrated circuit, comprising:
   a) a logic circuitry, containing inputs and outputs, said logic circuitry generating logic signals; and
   b) a macrocell, including inputs coupled to said logic circuitry outputs, said macrocell containing:
      i) an input-output pad means (90) for receiving said logic signals and outputting them;
      ii) a feedback means, responsive to said logic circuitry outputs; for feeding said logic signals back to said logic circuitry; and
      iii) first means for deactivating said pad means and simultaneously activating said feedback means.
2. A field programmable logic device which receives external signals, comprising:
   a programmable AND array having product term groupings wherein each of said groupings are containing nine product term lines serving as AND array outputs;
   means for producing product term logic signals in said AND array and routing said product signals over said nine product term lines;
   a first and second OR array, receiving eight of said nine product term lines and associated product term signals from each of said groupings in said AND array; and
   a plurality of macrocells, wherein each of said plurality of macrocells is coupled to a single output from each of said first and second OR arrays, each of said macrocells are coupled to said ninth product term line and receiving associated ninth product signals from an associated grouping in said AND array.
3. A field programmable logic device as recited in claim 2, wherein each of said macrocells comprise:
   at least one multiplexer responsive to said ninth product term signals from said ninth product term line.
4. A field programmable logic device as recited in claim 2, wherein each of said macrocells comprise:
   means for receiving the external signals and for outputting signals received from said two OR arrays;
   first routing means, responsive to said ninth product signals, for routing said external signals to said programmable AND array; and
   second routing means, separate from said first routing means and responsive to said ninth product signals, for routing said two OR array signals back to said AND array.
5. A macrocell connected between a logic circuit and an input/output (I/O) pad means, said logic circuit including inputs and an output producing a logic signal from an AND array and two OR arrays receiving logic signals from the AND array, said I/O pad means for outputting said logic signals or inputting external signals, the macrocell comprising:
   a) feedback means, responsive to said logic circuit output, for feeding said logic signals back to said logic circuit inputs;
   b) external input means, coupled to said pad, for routing said external signals into said macrocell;
   c) a connecting means, coupled to said external input means and said feedback means, for connecting the logic circuit inputs to either said feedback means or said external input means;
   d) gating means, coupled to said connecting means, for gating said connecting means between, coupling said external input means or coupling said feedback means, to said logic circuit inputs; and
   e) said gating means further comprises:
      e1) a first input, coupled to the AND array; and
      e2) a second input, coupled to the AND array.
6. A field programmable logic device, comprising:
   a) a single AND array, receiving external and internal input signals, and outputting product signals in response therefrom;
   b) a plurality of first OR arrays, each receiving a different and unique set of product signals and outputting a single first sum-of-products signal in response thereto;
   c) a plurality of second OR arrays, each receiving a different and unique set of product signals and outputting a single second sum-of-products signal in response thereto;
   d) a plurality of macrocells, each receiving:
      d1) exclusively and only a single first and second sum-of-products signal from a single matched pair of first and second OR arrays, and
      d2) exclusively a first and second product signal from and the AND array;
   e) each macrocell including:

e1) register means for creating a registered signal from the single first sum-of-products signal;

e2) means for creating a non-registered signal from the single from the singe second sum-of-products signal;

e3) a first multiplexer, receiving the registered and non-registered signal, and outputting a selected signal where the selected signal is one of the first and second sum-of-products signal;

e4) an input/output (I/O) pad that receives and then outputs the selected signal,
the I/O pad receives other external signals for inputting to the AND array;

e5) a tri-state device, directly receiving the selected signal, and outputting the selected signal directly to the I/O pad,
the tri-state device having:
a first state that allows outputting of the selected signal, and
a second state that prevents the outputting of the selected signal and allow the other external signal to be inputted over the I/O pad;

e6) a first feedback multiplexer, directly electrically coupled to the register means, for receiving a complement of the registered signal, and for receiving the other external signal from the I/O pad, and for outputting one of the two received signals now identified as a second selected signal;

e7) a second feedback multiplexer, directly electrically coupled to the first multiplexer, for receiving the selected signal, and for receiving the other external signal from the I/O pad, and for outputting one of the two received signals now identified as a third selected signal;

e8) a first control multiplexer, receiving the first product signal, and outputting a first control signal, where the activation of the first control signal, where the activation of the first and second states of the tri-state device is controlled by the first control signal;

e9) a single logic gate, receiving inputs from the second product signal and the first control signal, and outputting a second control signal, where the activation of the first and second feedback multiplexer is controlled by the second control signal; and e10) a third feedback multiplexer, receiving the second and third selected signals and outputting one of the received signals now identified as one of the internal input signals received by the AND array.

7. A PLD device, comprising:
a) a macrocell designed to exclusively receive simultaneously and only:
a1) a first input signal being a sum-of-products and originating from a first programmable OR array and an AND array,
a2) a second input signal being a sum-of-products and originating from a second programmable OR array and the AND array;
a3) a first product signal originating from the AND array;
a4) a second product signal originating from the AND array;
a5) the first input signal can only become a registered signal once entering the macrocell; and
a6) the second input signal, simultaneously with the first input signal, can only become a non-registered signal once entering the macrocell and is never routed back to the PLD device;

b) first decision means, electrically coupled to the registered signal and non-registered signal, for determining if the registered or non-registered signal will be output from the first decision means;

c) an input/output (I/O) pad;

d) gating means, receiving the output from the first decision means, for either being enabled to output the selected registered or non-registered signal from the PLD over the I/O pad or being disabled thus allowing an external signal to be inputted into the macrocell over the I/O pad;

e) second decision means for determining whether the registered, non-registered, or external signal will be routed into the AND array; and f) determining means, having an input from the first product signal, for outputting an enabling or disabling signal that either enables or disables the gating means respectively; and g) a logic gate, receiving the signals from the determining means, and receiving the second product signal, for switching the second decision means for routing signals into the AND array.

* * * * *